United States Patent [19]
Nakazato et al.

[11] Patent Number: 5,601,229
[45] Date of Patent: Feb. 11, 1997

[54] CONDUCTIVE METAL BALL ATTACHING APPARATUS AND METHOD, AND BUMP FORMING METHOD

[75] Inventors: Siniti Nakazato; Teruaki Kasai, both of Fukuoka, Japan

[73] Assignee: Matsushita Electric Industrial Co., Ltd., Osaka, Japan

[21] Appl. No.: 562,959

[22] Filed: Nov. 27, 1995

[30]    Foreign Application Priority Data

Nov. 28, 1994 [JP] Japan .................................. 6-292937

[51] Int. Cl.$^6$ ............................ H01L 21/60; B23K 1/00; B23K 3/00
[52] U.S. Cl. ............................ 288/246; 228/254; 228/41; 437/183; 221/211
[58] Field of Search ..................... 228/103, 105, 228/246, 254, 180.22, 41, 56.3; 427/123; 221/211; 414/752; 437/183

[56]            References Cited

U.S. PATENT DOCUMENTS

| | | | |
|---|---|---|---|
| 5,088,639 | 2/1992 | Gondotra et al. | 228/246 |
| 5,284,287 | 2/1994 | Wilson et al. | 228/254 |
| 5,445,313 | 8/1995 | Boyd et al. | 228/6.2 |
| 5,467,913 | 11/1995 | Namekawa et al. | 228/41 |
| 5,540,377 | 7/1996 | Ito | 228/41 |

*Primary Examiner*—Samuel M. Heinrich
*Attorney, Agent, or Firm*—Lowe, Price, LeBlanc & Becker

[57] ABSTRACT

In a solder ball attaching apparatus, a pickup head is lowered and raised just above a solder ball feed section so as to pick up a large number of solder balls. The pickup head then moves to a position just above a flux feed section where the pickup head is lowered and raised so as to flux the solder balls. Further, the pickup head moves to a position just above a workpiece where the pickup head is lowered and raised so as to attach the solder balls onto electrodes of the workpiece. Alongside a transfer path of the pickup head are arranged first and second line light sources, a light-emitting element and a light-receiving element for monitoring presence or absence of a solder ball pickup error, dislodging of the solder ball and a solder ball attaching error.

24 Claims, 9 Drawing Sheets

CONDUCTIVE METAL BALL ATTACHING APPARATUS AND METHOD, AND BUMP FORMING METHOD

BACKGROUND OF THE INVENTION

1. Field of the Invention

The present invention relates to an apparatus and a method for attaching conductive metal balls to electrodes of a workpiece, and a method for forming bumps.

2. Description of the Prior Art

It is known to form bumps (protruding electrodes) on electrodes of a workpiece, such as a chip or a substrate, by attaching solder balls onto the electrodes of the workpiece, heating to melt the attached solder balls and then cooling the molten solder balls to solidify.

Further, it is known to use a pickup head for attaching the solder balls onto the electrodes of the workpiece as disclosed in U.S. Pat. No. 5,284,287. In this method, a large number of the solder balls are vacuum-absorbed to respective absorber holes formed at a bottom wall of the pickup head, and the pickup head is lowered and raised just above the workpiece so as to attach the solder balls onto the corresponding electrodes of the workpiece. According to this method, a large number of the solder balls can be attached onto the electrodes of the workpiece at a time.

As appreciated, when using the pickup head, it is essential that the solder balls are absorbed to all the absorber holes and that all the absorbed solder balls are attached onto the workpiece. Otherwise, the processed workpiece becomes defective. Accordingly, it is necessary to perform the solder ball attaching procedure while monitoring presence or absence of a solder ball pickup error or a solder ball attaching error. However, up to now, a system which can satisfy such a requirement has not yet been achieved.

SUMMARY OF THE INVENTION

Therefore, it is an object of the present invention to provide an improved conductive metal ball attaching apparatus.

It is another object of the present invention to provide an improved conductive metal ball attaching method.

It is another object of the present invention to provide an improved bump forming method.

According to one aspect of the present invention, a conductive metal ball attaching apparatus for attaching a plurality of conductive metal balls onto electrodes of a workpiece, comprises a pickup head having at its lower side a plurality of absorber holes for vacuum-absorbing the conductive metal balls: light detecting means for detecting light entering the pickup head through at least one of the absorber holes; a conductive metal ball feed section for feeding the conductive metal balls to the pickup head; a bonding material feed section for feeding a bonding material: a workpiece positioning section for positioning the workpiece: a discard section for discarding the conductive metal ball absorbed to the absorber hole of the pickup head and applied with the bonding material; pickup head moving means for moving the pickup head to the conductive metal ball feed section, the bonding material feed section, the workpiece positioning section and the discard section: first light irradiating means for irradiating light onto the lower side of the pickup head while the pickup head moves from the conductive metal ball feed section to the bonding material feed section; second light irradiating means for irradiating light onto the lower side of the pickup head while the pickup head moves from the bonding material feed section to the workpiece positioning section; and attaching error detecting means for detecting an attaching error of the conductive metal ball onto the workpiece.

According to another aspect of the present invention, a conductive metal ball attaching method comprises a first step of vacuum-absorbing conductive metal balls to respective absorber holes formed at a lower side of a pickup head for picking them up: a second step of detecting whether the conductive metal balls are vacuum-absorbed to all of the absorber holes: a third step of applying a bonding material to a lower side of each of the conductive metal balls vacuum-absorbed to the absorber holes: a fourth step of detecting presence or absence of the conductive metal ball dislodged from the pickup head during the third step: a fifth step of attaching the conductive metal balls onto electrodes of a workpiece, the conductive metal balls absorbed to the absorber holes of the pickup head and applied with the bonding material: and a sixth step of detecting an attaching error whether all the conductive metal balls absorbed to the absorber holes of the pickup head are attached onto the workpiece.

According to another aspect of the present invention, a bump forming method for attaching solder balls onto electrodes of a workpiece to form bumps, comprises a first step of vacuum-absorbing the solder balls to respective absorber holes formed at a lower side of a pickup head for picking them up; a second step of detecting whether the solder balls are vacuum-absorbed to all of the absorber holes; a third step of fluxing a lower side of each of the solder balls vacuum-absorbed to the absorber holes; a fourth step of detecting presence or absence of the solder ball dislodged from the pickup head during the third step; a fifth step of attaching the solder balls onto the electrodes of the workpiece, the solder balls absorbed to the absorber holes of the pickup head and fluxed; a sixth step of detecting an attaching error whether all the solder balls absorbed to the absorber holes of the pickup head are attached onto the workpiece; and a seventh step of heating the workpiece to melt the solder balls attached to the electrodes of the workpiece.

According to another aspect of the present invention, a bump forming method for attaching conductive metal balls onto electrodes of a workpiece to form bumps, comprises a first step of vacuum-absorbing the conductive metal balls to respective absorber holes formed at a lower side of a pickup head for picking them up; a second step of detecting whether the conductive metal balls are vacuum-absorbed to all of the absorber holes; a third step of applying an adhesive to a lower side of each of the conductive metal balls vacuum-absorbed to the absorber holes; a fourth step of detecting presence or absence of the conductive metal ball dislodged from the pickup head during the third step; a fifth step of attaching the conductive metal balls onto the electrodes of the workpiece, the conductive metal balls absorbed to the absorber holes of the pickup head and applied with the bond; a sixth step of detecting an attaching error whether all the conductive metal balls absorbed to the absorber holes of the pickup head are attached onto the workpiece; and a seventh step of heating the workpiece to harden the adhesive applied to the conductive metal balls.

BRIEF DESCRIPTION OF THE DRAWINGS

The present invention will be understood more fully from the detailed description given hereinbelow, taken in conjunction with the accompanying drawings.

In the drawings.

DESCRIPTION OF THE PREFERRED EMBODIMENT

Now, preferred embodiments of the present invention will be described hereinbelow with reference to the accompanying drawings. The same or like components are represented by the same reference signs throughout the figures.

Figure 1:
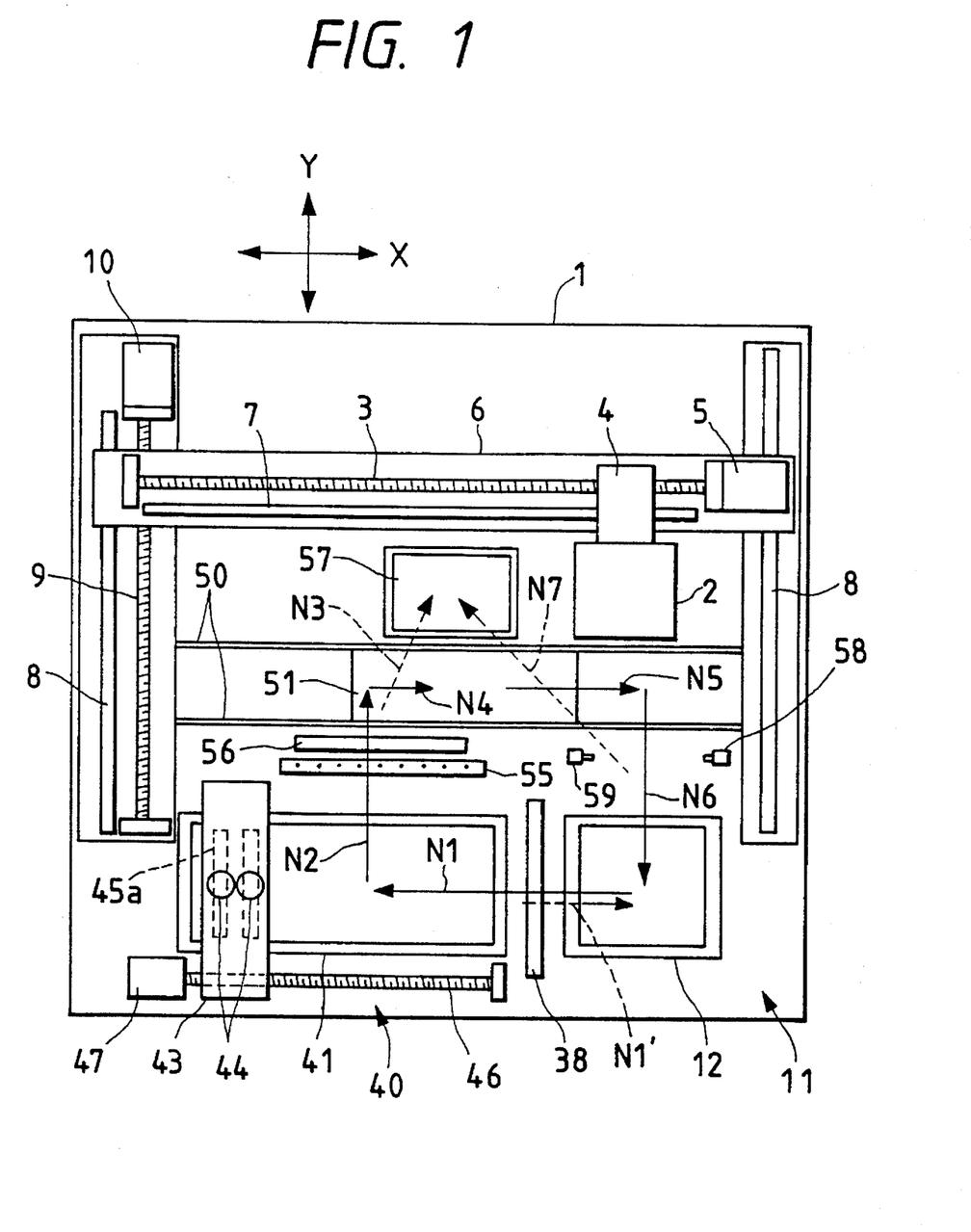
FIG. 1 is a plan view showing a solder ball attaching apparatus according to a first preferred embodiment of the present invention.
Figure 2:
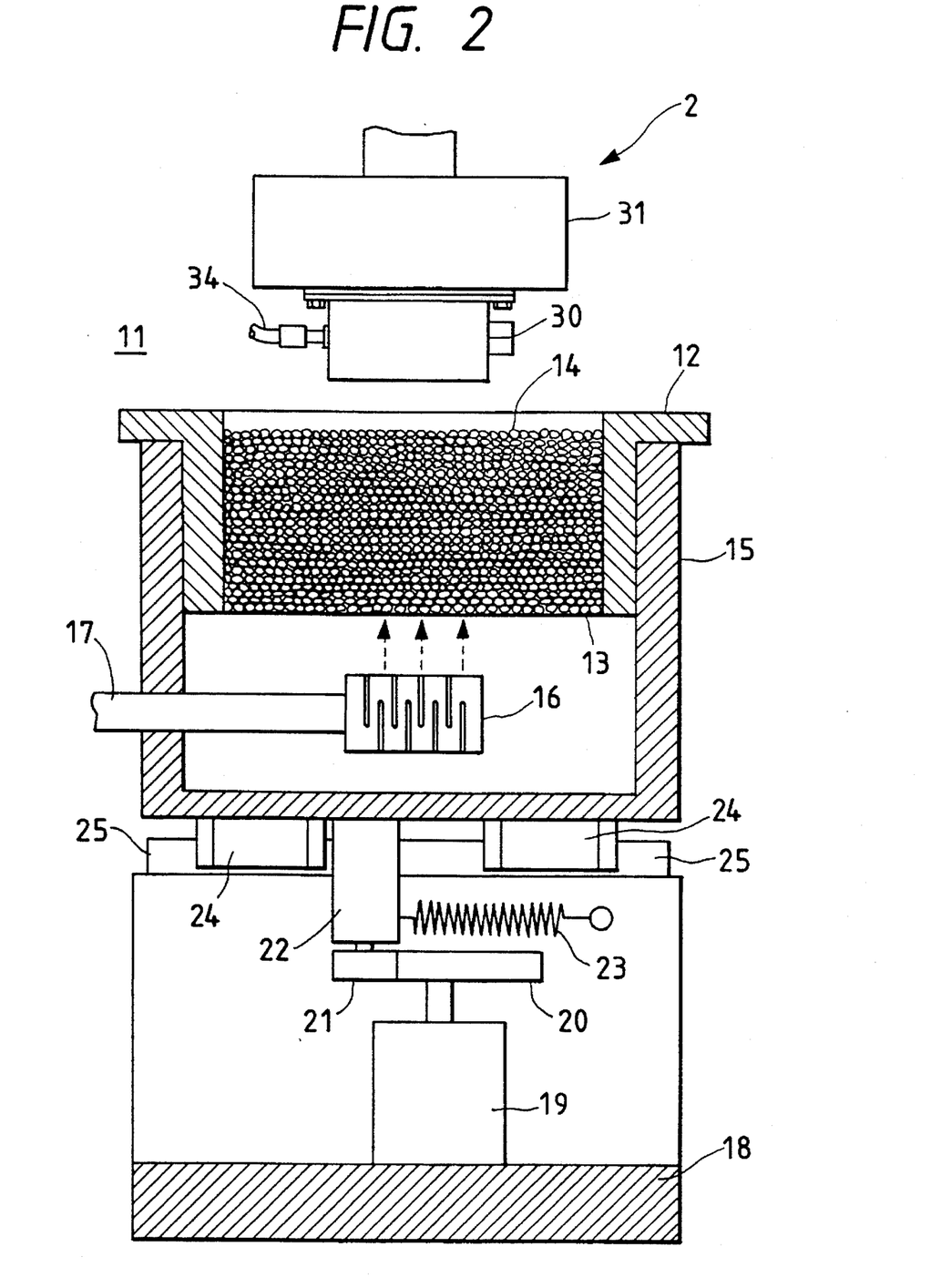
FIG. 2 is a vertical sectional view of a solder ball feed section of the solder ball attaching apparatus shown in FIG. 1.
Figure 3:
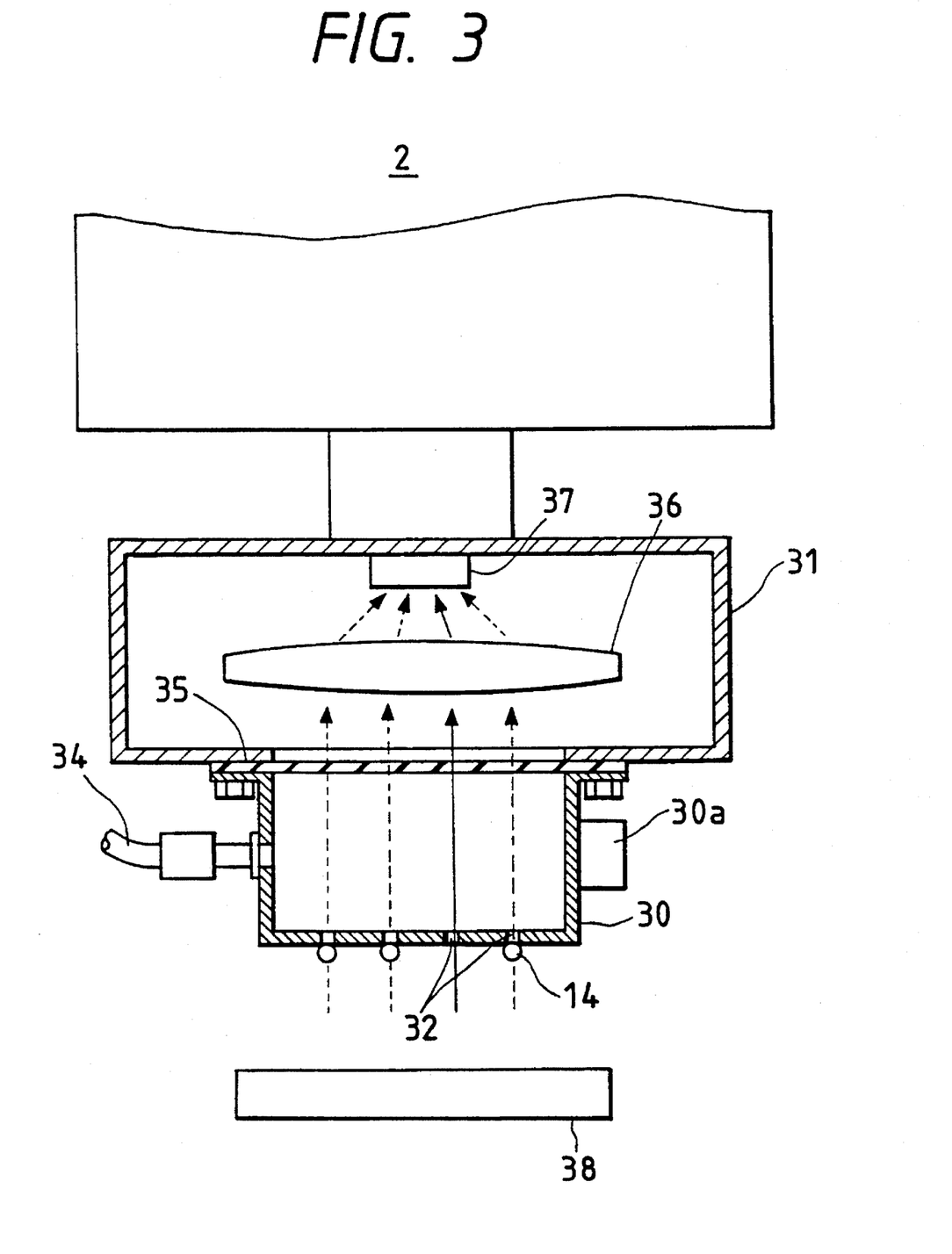
FIG. 3 is a vertical sectional view of a pickup head incorporated in the solder ball attaching apparatus shown in FIG. 1.
Figure 4:
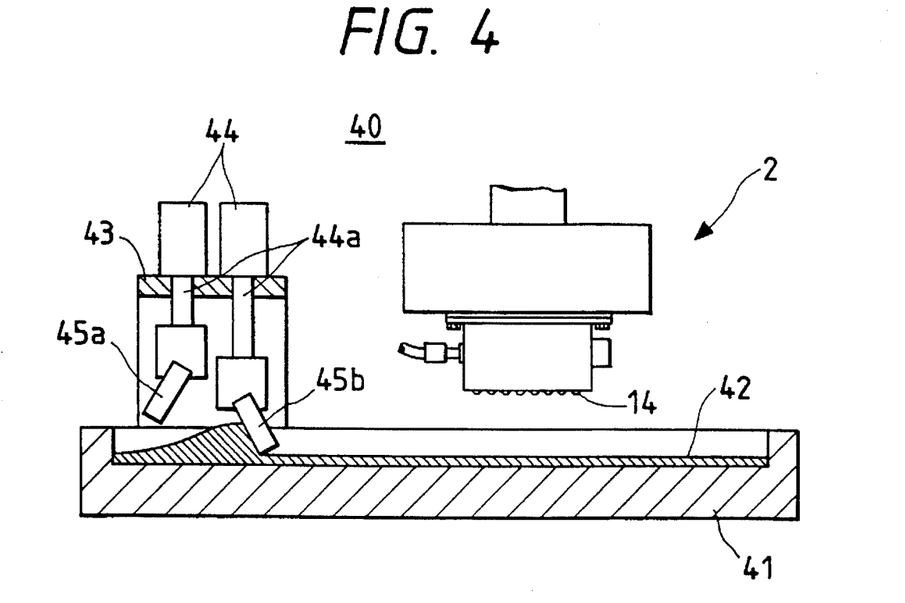
FIG. 4 is a vertical sectional view of a flux feed section of the solder ball attaching apparatus shown in FIG. 1.
Figure 5A:
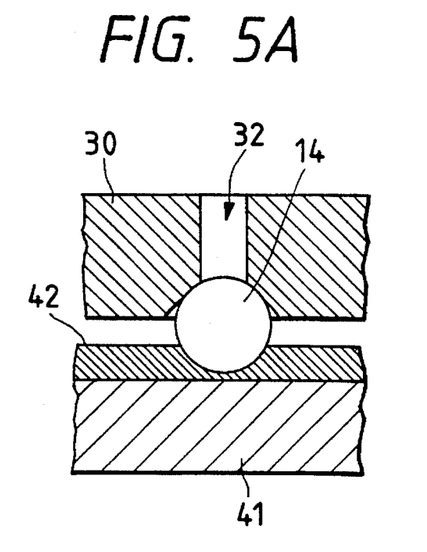
FIGS. 5A and 5B are enlarged sectional views, respectively, of the main portion for explaining a fluxing procedure of the solder ball attaching apparatus shown in FIG. 1.
Figure 5B:
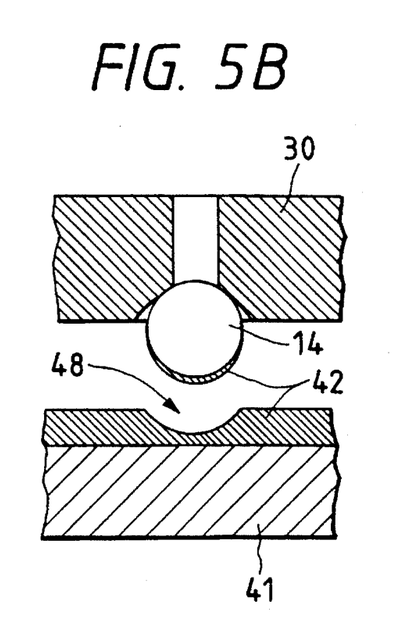
Figure 6A:
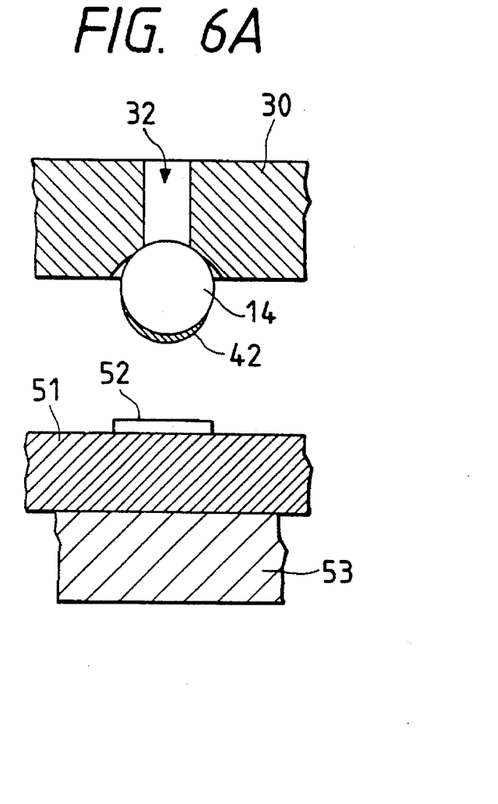
FIGS. 6A and 6B are enlarged sectional views, respectively, of the main portion for explaining a solder ball attaching procedure of the solder ball attaching apparatus shown in FIG. 1.
Figure 6B:
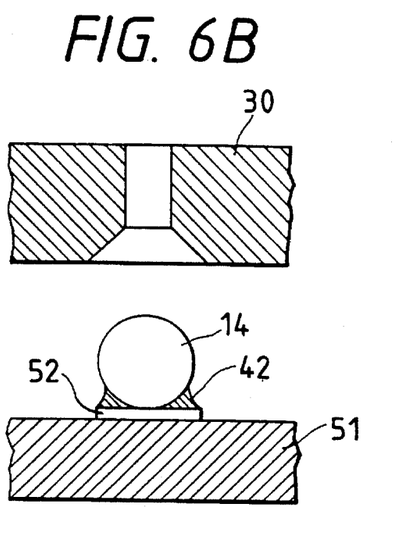
Figure 7:
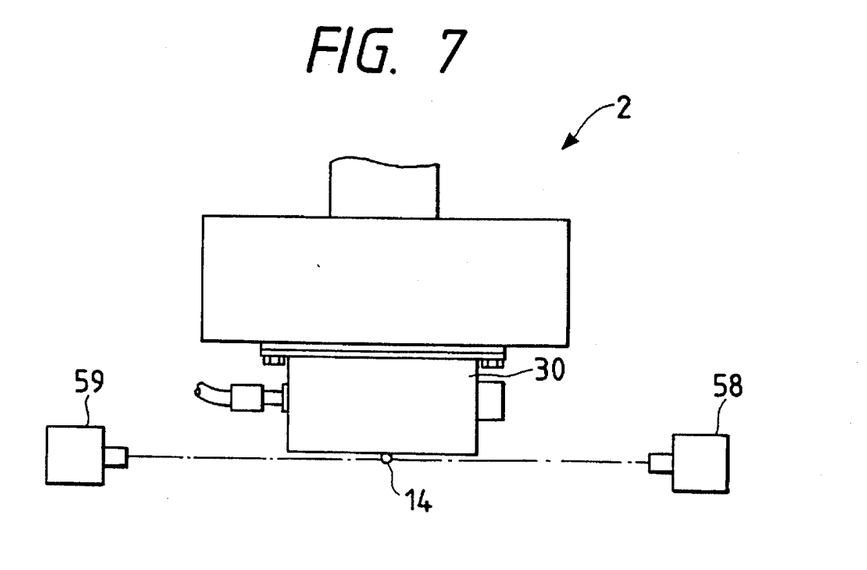
FIG. 7 is a side view for explaining a solder ball attaching error detecting procedure of the solder ball attaching apparatus shown in FIG. 1.
Figure 8:
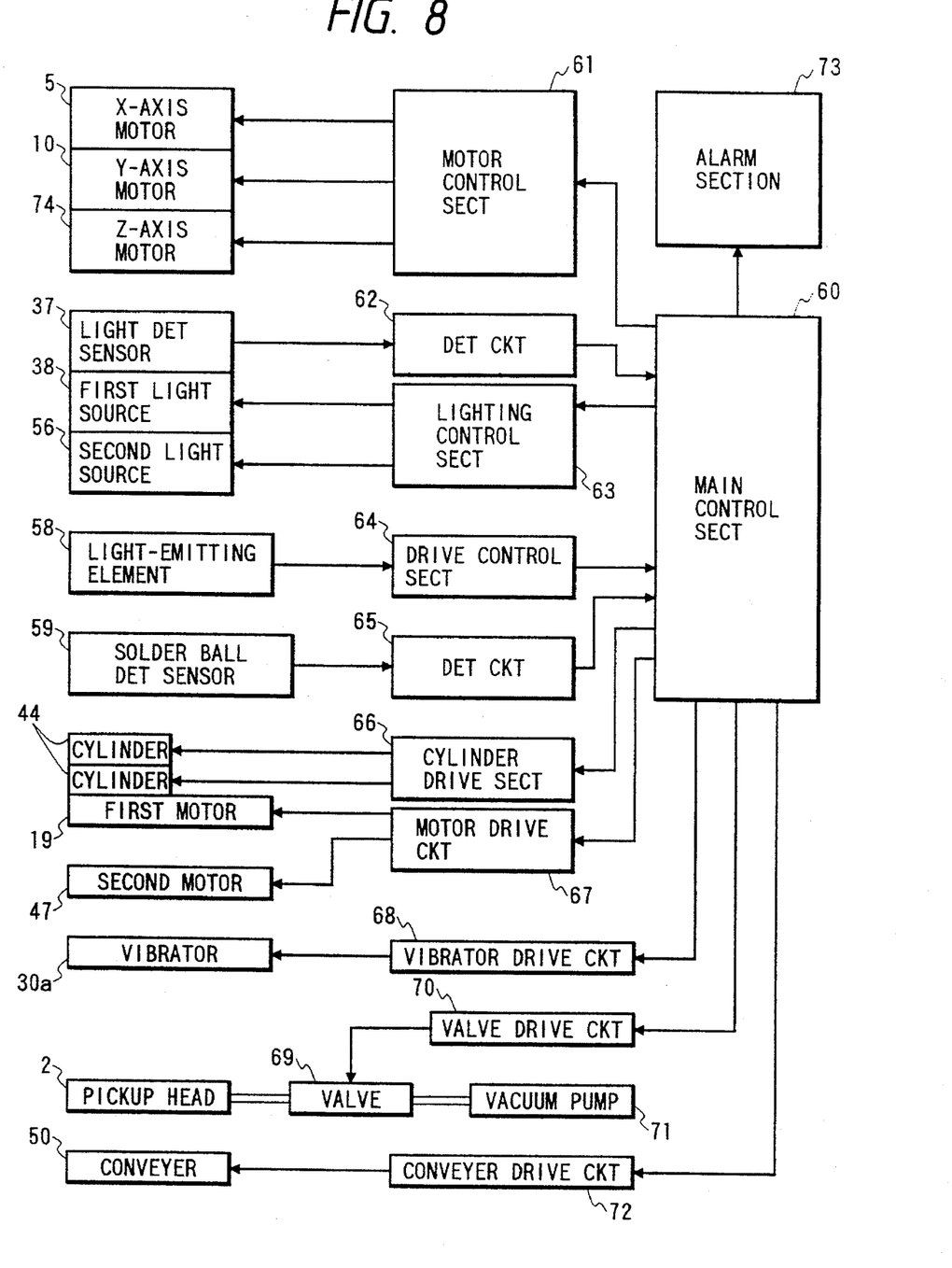
FIG. 8 is a block diagram showing a control system of the solder ball attaching apparatus shown in FIG. 1.
Figure 9:
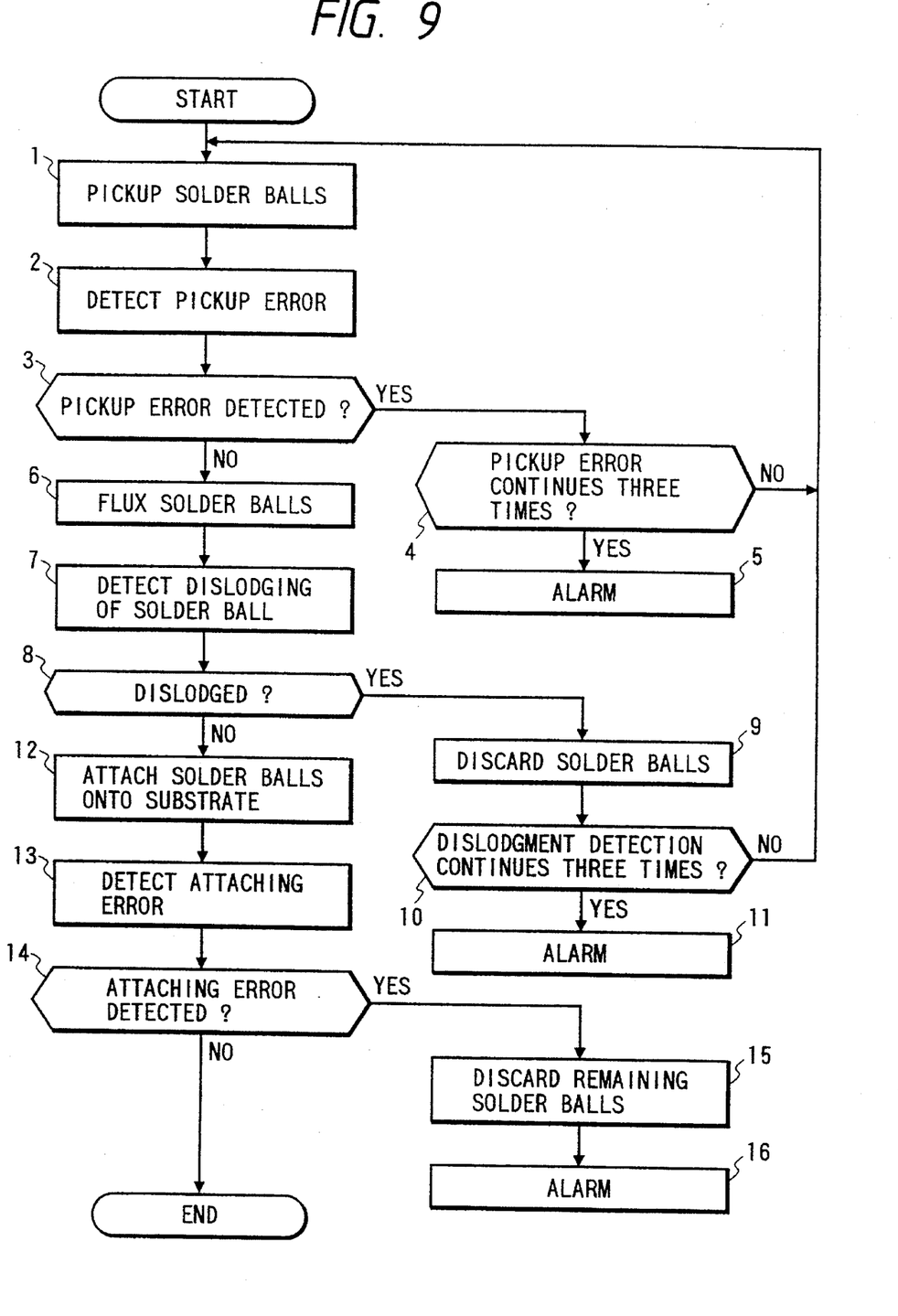
FIG. 9 is a flowchart showing the overall operation of the solder ball attaching apparatus shown in FIG. 1.

FIG. 1 is a plan view showing the overall structure of a solder ball attaching apparatus according to a first preferred embodiment of the present invention. FIG. 2 is a vertical sectional view of a solder ball feed section of the solder ball attaching apparatus shown in FIG. 1. FIG. 3 is a vertical sectional view of a pickup head incorporated in the solder ball attaching apparatus shown in FIG. 1. FIG. 4 is a vertical sectional view of a flux feed section of the solder ball attaching apparatus shown in FIG. 1. FIGS. 5A and 5B are enlarged sectional views, respectively, of the main portion for explaining a fluxing procedure of the solder ball attaching apparatus shown in FIG. 1. FIGS. 6A and 6B are enlarged sectional views, respectively, of the main portion for explaining a solder ball attaching procedure of the solder ball attaching apparatus shown in FIG. 1. FIG. 7 is a side view for explaining a solder ball attaching error detecting procedure of the solder ball attaching apparatus shown in FIG. 1. FIG. 8 is a block diagram showing a control system of the solder ball attaching apparatus shown in FIG. 1. FIG. 9 is a flowchart showing the overall operation of the solder ball attaching apparatus shown in FIG. 1.

In FIG. 1, numeral 1 denotes a base on which various components are provided in the following manner:

Numeral 2 denotes a vacuum pickup head which is arranged to move vertically by vertical moving means (not shown) and horizontally by horizontal moving means as will be described hereinbelow.

Numeral 3 denotes an X-direction feed screw rotatably mounted on a support bar 6. A nut 4 is integrally coupled to a backside of the pickup head 2 and engaged with the feed screw 3. Numeral 5 denotes an X-axis motor fixed on the support bar 6 for rotating the feed screw 3, and numeral 7 denotes a guide rail for displacement of the nut 4 in X directions. With this arrangement, when the X-axis motor 5 is rotated in the forward or reverse direction to rotate the feed screw 3 in the forward or reverse direction, the nut 4 and thus the pickup head 2 move in the X direction along the feed screw 3 and the guide rail 7.

A pair of Y-direction guide rails 8 are provided on both (right and left in FIG. 1) sides of the base 1. The support bar 6 is slidably mounted on these guide rails 8. Numeral 9 denotes a Y-direction feed screw driven by a Y-axis motor 10. A nut (not shown) is integrally fixed to a lower side of the support bar 6 and engaged with the feed screw 9. With this arrangement, when the Y-axis motor 10 is rotated in the forward or reverse direction to rotate the feed screw 9 in the forward or reverse direction, the support bar 6 and thus the pickup head 2 move in a Y direction along the guide rails 8.

At a corner of the base 1 is provided a solder ball feed section 11. A detailed structure thereof will be described hereinbelow with reference to FIG. 2. In FIG. 2, numeral 12 denotes a ball container having a bottom 13 in the form of a mesh for allowing gas to pass therethrough. An abundance of solder balls 14 are stored in the ball container 12. The ball container 12 is supported in a box 15. The box 15 has a space at its lower part where a gas blowoff unit 16 is provided. The blowoff unit 16 is connected to a tip of a tube 17 which is in turn connected to a gas feed section (not shown). The gas transferred through the tube 17 is blown off from the blowoff unit 16 and flows upward to pass through the mesh bottom 13 into the ball container 12. This causes the solder balls 14 within the ball container 12 to become mobile. Air or gaseous nitrogen or the like may be used as the gas for this purpose.

Now, a mechanism for reciprocating the box 15 in lateral (right and left in FIG. 2) directions will be described hereinbelow.

In FIG. 2, numeral 18 denotes a pedestal fixed on the base 1. A first motor 19 is fixed on the pedestal 18. Numeral 20 denotes a cam to be rotated by the first motor 19, and numeral 21 denotes a cam follower contacting the cam 20. The cam follower 21 is fixed to a lower side of a block 22 which is in turn fixed to a lower side of the box 15. By means of a biasing force of a spring 23, the cam follower 21 is urged toward the cam 20 so as to be in constant contact with a circumference of the cam 20. Sliders 24 are secured to the lower side of the box 15. The sliders 24 are each slidably engaged with a guide rail 25 arranged on an upper side of the pedestal 18. With this arrangement, when the first motor 19 is driven to rotate the cam 20, the cam follower 21 reciprocates in the lateral (right and left in FIG. 2) directions so that the box 15 reciprocates in the right and left directions along the guide rail 25. This causes the solder balls 14 within the ball container 12 to become mobile.

Now, a structure of the pickup head 2 will be described hereinbelow with reference to FIGS. 2 and 3.

The pickup head 2 includes a lower case 30 and an upper case 31. The lower case 30 has a bottom wall which is formed with an abundance of absorber openings or holes 32, arranged in a matrix, for vacuum-absorbing the solder balls 14. The lower case 30 is connected to a vacuum pump 71 (see FIG. 8) via a tube 34. When the vacuum pump 71 is operated to evacuate the inside of the lower case 30 via the tube 34, the solder balls 14 are vacuum-absorbed to the absorber holes 32. Accordingly, by positioning the pickup head 2 just above the solder ball feed section 11 as shown in FIG. 2 and then lowering the pickup head 2, using the vertical moving means (not shown), to bring a lower side of the lower case 30 into the solder balls 14, the solder balls 14 are vacuum-absorbed to the absorber holes 32. Then, by raising the pickup head 2, the solder balls 14 are picked up and transferred from the ball container 12.

During the absorbing procedure, the gas is blown off from the blowoff unit 16 and the first motor 19 is driven to reciprocate the box 15, so as to render the solder balls 14 in the container 12 mobile as described above. As appreciated, the mobile state of the solder balls 14 facilitates the absorption of the solder balls 14 to the absorber holes 32.

The reciprocation of the box 15 not only works to render the solder balls 14 mobile, but also works to hold horizontal an upper surface formed by the solder balls 14 within the ball container 12 as a whole so that the absorption of the solder balls 14 to all the absorber holes 32 is further facilitated. Further, when two or more solder balls 14 tend to be absorbed to one absorber hole 32, an excessive solder ball or excessive solder balls are shaken off so as to ensure one solder ball 14 to each absorber hole 32. Numeral 30a represents a vibrator which is used for vibrating the lower case 30 when forcing down the solder balls 14 from the pickup head 2.

In FIG. 3, between the lower case 30 and the upper case 31 is provided a transparent plate 35. Further, a condensing element 36 is arranged within the upper case 31 for condensing light onto a light detecting sensor 37 located above the condensing element 36.

In FIG. 1, a first line light source 38 is provided on a side of the solder ball feed section 11. When the pickup head 2 picks up the solder balls 14 at the solder ball feed section 11 and moves leftward as indicated by an arrow N1 in the figure, the pickup head 2 passes over the first line light source 38. FIG. 3 shows this state. The first line light source 38 irradiates light toward the lower side of the lower case 30. At this time, if all the absorber holes 32 hold the solder balls 14, no light enters the lower case 30 via the absorber holes 32. On the other hand, if at least one absorber hole 32 fails to hold the solder ball 14, the light enters the lower case 30 and is incident upon the condensing element 36 to be condensed onto the light detecting sensor 37 as indicated by solid-line arrows in the figure. Accordingly, the apparatus determines an occurrence of an pickup error of the pickup head 2 at the solder ball feed section 11 when the light enters the light detecting sensor 37. That is, the apparatus determines presence or absence of the pickup error depending on presence or absence of the leakage light through the absorber hole 32.

In FIG. 1, a flux feed section 40 is further provided on the base 1 alongside the solder ball feed section 11. A detailed structure of the flux feed section 40 will be described hereinbelow with reference to FIGS. 1 and 4.

Numeral 41 denotes a shallow flux container which stores flux therein. A frame 43 is arranged over the flux container 41. On the frame 43 are installed two cylinders 44 with movable rods 44a. Further, squeegees 45a and 45b are coupled to the rods 44a, respectively, so that, when the rods 44a displace vertically, the squeegees 45a and 45b also displace with the corresponding rods 44a. In FIG. 1, a feed screw 46 is provided alongside the flux container 41. Although not shown, a nut is integrally coupled to the frame 43. Thus, when a second motor 47 is rotated in the forward or reverse direction to rotate the feed screw 46 in the forward or reverse direction, the frame 43 moves along the feed screw 46.

FIG. 4 shows the state wherein the squeegee 45a is at an upper position, while the squeegee 45b is lowered to bring a lower side of the squeegee 45b into flux 42. In this state, by moving the frame 43 and thus the squeegee 45b leftward in the figure, the flux 42 stored in the flux container 41 is leveled. To the contrary, by moving the frame 43 and thus the squeegee 45a rightward in the figure while the squeegee 45a is lowered into the flux 42 and the squeegee 45b is rased away from the flux 42, the flux 42 is leveled by a lower side of the squeegee 45a.

In FIG. 1, as described above, the pickup head 2 holding the solder balls 14 passes over the first line light source 38 as indicated by the arrow N1. When no pickup error is detected, the pickup head 2 further moves to the flux feed section 40 and stops at a position Just above the flux container 41. Then, the pickup head 2 is lowered and raised so that a lower side of each of the solder balls 14 is fluxed. FIGS. 5A and 5B show this process. Specifically, as shown in FIG. 5A, the pickup head 2 is lowered to immerse the solder balls 14 in the flux 42, and then as shown in FIG. 5B, the pickup head 2 is rased so that the lower side of each solder ball 14 is fluxed.

The flux 42 is a fluid having a high viscosity. Accordingly, when fluxing the solder ball 14, a concave portion 48 is formed on an upper surface of the flux 42 as shown in FIG. 5B so that the upper surface thereof becomes rough. Thus, in the next fluxing process, the solder balls 14 are not properly fluxed. In view of this, after fluxing the solder balls 14 and moving the pickup head 2 in a direction identified by an arrow N2, the flux 42 is leveled by the squeegees 45a and 45b as described above.

In FIG. 1, a conveyer 50, as a substrate positioning section, is provided at the center of the base 1. Numeral 51 denotes a substrate which is transferred rightward in the figure on the conveyer 50. As shown in FIGS. 6A and 6B, the pickup head 2 transfers the solder balls 14 to a position just above the substrate 51 and then attach them onto corresponding electrodes 52 formed on an upper surface of the substrate 51. Between the flux feed section 40 and the conveyer 50, an ionizer 55 as a charge-removing means and a second line light source 56 are arranged. The ionizer 55 blows ions toward the pickup head 2 passing thereover so as to neutralize charges on the lower case 30 and the solder balls 14. This is necessary because of the following reason: Specifically, as shown in FIG. 6A, a chip 53 formed with an electronic circuit may be attached to a lower side of the substrate 51. In this case, if the solder balls 14 or the lower case 30 is charged, it is possible that the electronic circuit of the chip 53 is destroyed due to the charged static electricity when the solder balls 14 land on the electrodes 52 of the substrate 51. Thus, the charges are neutralized by blowing ions prior to attaching the solder balls 14 onto the substrate 51.

Since the flux 42 has a large viscosity as described above, it is possible that the solder ball/balls 14 falls/fall off the absorber hole/holes 32 when fluxing the solder balls 14.

Accordingly, the second line light source 56, like the first line light source 38, irradiates light from below toward the lower side of the pickup head 2 for detecting any absorber hole/holes 32 from which the solder ball/balls 14 is/are dislodged.

In FIG. 1, numeral 57 denotes a discard box arranged alongside the conveyer 50. Further, between the conveyer 50 and the solder ball feed section 11 are provided a light-emitting element 58 and a light-receiving element 59. As shown in FIG. 7, the light-emitting element 58 irradiates light toward the light-receiving element 59 along the lower side of the lower case 30. At this time, if at least one solder ball 14 is held on the lower side of the lower case 30, the light is intercepted so that the light-receiving element 59 can not receive the light. Thus, depending on reception of the light, the apparatus determines whether the solder ball 14 remains on the lower side of the lower case 30, that is, whether a solder ball attaching error occurs.

FIG. 8 is a block diagram showing a control system of the solder ball attaching apparatus.

In FIG. 8, numeral 60 denotes a main control section for controlling the overall operation of the apparatus. The X-axis motor 5, the Y-axis motor 10 and a Z-axis motor 74 are connected to the main control section 60 via a motor control section 61. The Z-axis motor 74 drives the foregoing vertical moving means for vertically moving the pickup head 2. The light detecting sensor 37 is connected to the main control section 60 via a detection circuit 62. The first line light source 38 and the second line light source 56 are connected to the main control section 60 via a lighting control section 63. The light-emitting element 58 is connected to the main control section 60 via a drive control section 64. The light-receiving element 59 as a solder ball detecting sensor is connected to the main control section 60 via a detection circuit 65.

Further, the cylinders 44 are connected to the main control section 60 via a cylinder drive section 66, and the first motor 19 and the second motor 47 are connected to the main control section 60 via a motor drive circuit 67. The vibrator 30a is connected to the main control section 60 via a vibrator drive circuit 68, and the pickup head 2 is connected to the main control section 60 via a valve 69 and a valve drive circuit 70. The valve 69 is connected to the vacuum pump 71. The conveyer 50 is connected to the main control section 60 via a conveyer drive circuit 72. Further, a signal or alarm section 73 in the form of a buzzer, a lamp or the like is connected to the main control section 60 for alarming an operator when the main control section 60 detects an abnormal condition.

The solder ball attaching apparatus according to this embodiment has the foregoing structure, Now, the overall operation of the apparatus will be described hereinbelow with reference to a flowchart shown in FIG. 9.

At step 1, the pickup head 2 picks up the solder balls 14 at the solder ball feed section 11 in the following manner: By driving the X-axis motor 5 and the Y-axis motor 10 in FIG. 1, the pickup head 2 moves to the position just above the solder ball feed section 11 as shown in FIG. 2. Then, the pickup head 2 is lowered and raised by the vertical moving means so as to absorb the solder balls 14 in the ball container 12 to the respective absorber holes 32 and to pick up the solder balls 14 from within the ball container 12. At this time, the gas is blown off from the blowoff unit 16 and the first motor 19 is driven to reciprocate the box 15, so as to render the solder balls 14 in the ball container 12 mobile for facilitating the absorption of the solder balls 14 by the pickup head 2.

Subsequently, at step 2, presence or absence of the solder ball pickup error is detected in the following manner: In FIG. 1, the pickup head 2 moves toward the flux feed section 40 in the N1 direction. On the midway, the pickup head 2 passes over the first line light source 38. At this time, as shown in FIG. 3, the light is irradiated from the first line light source 38 toward the pickup head 2 so that the main control section 60 detects presence or absence of the pickup error depending on whether the light is incident upon the light detecting sensor 37. If the light is incident upon the light detecting sensor 37, not all the absorber holes 32 hold the solder balls 14 so that the main control section 60 determines presence of the pickup error at step 3. In this case, the routine proceeds to step 4 to repeat steps 1 to 3. Specifically, the pickup head 2 returns to the solder ball feed section 11 as indicated by a dotted-line arrow N1' in FIG. 1, where the pickup head 2 is again lowered and raised to pick up the solder balls 14 from the ball container 12. Thereafter, the pickup head 2 again moves toward the flux feed section 40 as indicated by the solid-line arrow N1. On the midway, presence or absence of the solder ball pickup error is again detected when the pickup head 2 passes over the first line light source 38. If the solder ball pickup error is detected, for example, three times in a continuos manner, the main control section 60 notifies it to the operator via the alarm section 73 through steps 4 and 5, as determining that some failure occurs in the apparatus.

On the other hand, if the solder ball pickup error is not detected at step 3, the routine proceeds to step 6 where the pickup head 2 moves to the position just above the flux feed section 40 and then is lowered and raised so as to flux the lower sides of the solder balls 14 as described before with reference to FIGS. 4, 5A and 5B. Subsequently, the pickup head 2 moves to the position just above the substrate 51 as indicated by the arrow N2 in FIG. 1. On the midway, the pickup head 2 is applied with ions blown off from the ionizer 55 so that charges on the solder balls 14 and the lower case 30 are removed. Then, the pickup head 2 passes over the second line light source 56, where it is checked whether all the absorber holes 32 hold the solder balls 14 through steps 7 and 8, in the same manner as the solder ball pickup error detection. This check is necessary in view of the following reason: When fluxing the solder balls 14 at step 6, it is possible that the solder ball/balls 14 falls/fall off or is/are dislodged from the absorber hole/holes 32 due to the high viscosity of the flux 42.

If the solder ball dislodgment is detected at step 8, the routine proceeds to step 9 where the pickup head 2 moves to a position just above the discard box 57 as indicated by a dotted arrow N3 in FIG. 1. Then, by releasing the vacuum in the lower case 30, all the solder balls 14 absorbed to the respective absorber holes 32 fall into the discard box 57 for recovery. Subsequently, the routine proceeds to step 10 to repeat step 1 and subsequent steps. Specifically, the pickup head 2 moves to the position just above the solder ball feed section 11 to restart the process from step 1. On the other hand, if the solder ball dislodgment detection continues three times at step 10, the routine proceeds to step 11 where the main control section 60 notifies it to the operator via the alarm section 73, as determining that some failure occurs in the apparatus.

If no dislodgment of the solder ball 14 is detected at step 8, the routine proceeds to step 12 where the pickup head 2 moves just above the substrate 51 as indicated by an arrow N4 in FIG. 1. Then, as described before with reference to FIGS. 6A and 6B, the pickup head 2 is lowered to land the solder balls 14 on the electrodes 52 of the substrate 51. By releasing the vacuum in the lower case 30 and raising the pickup head 2, the solder balls 14 are attached onto the electrodes 52.

Thereafter, the routine proceeds to steps 13 and 14 where presence or absence of the solder ball attaching error is detected. Specifically, the pickup head 12 moves toward the solder ball feed section 11 as indicated by arrows N5 and N6 in FIG. 1. On the midway, as described before with reference to FIG. 7, it is checked using the light-emitting element 58 and the light-receiving element 59 whether at least one solder ball 14 is held on the lower side of the lower case 30. If the solder ball 14 is detected, it is determined that not all the solder balls 14 are attached to the substrate 51 at step 12 and thus the solder ball attaching error has occurred. The routine then proceeds to step 15 where the pickup head 2 moves to the position just above the discard box 57 to discard the remaining solder ball/balls 14 into the discard box 57. When discarding the remaining solder ball/balls 14, air is introduced into the lower case 30 to be blown off through the absorber holes 32 so that the remaining solder ball/balls 14 fall off the corresponding absorber hole/holes 32 into the discard box 57. Then, at step 16, the main control section 60 notifies it to the operator via the alarm section 73.

On the other hand, no solder ball attaching error is detected at step 14, the pickup head 2 returns to the position just above the solder ball feed section 11 to repeat the process from step 1.

As appreciated, if the solder ball attaching error is detected at step 14, the processed substrate 51 is defective so that this defective substrate 51 is removed from the production line.

Figure 10:
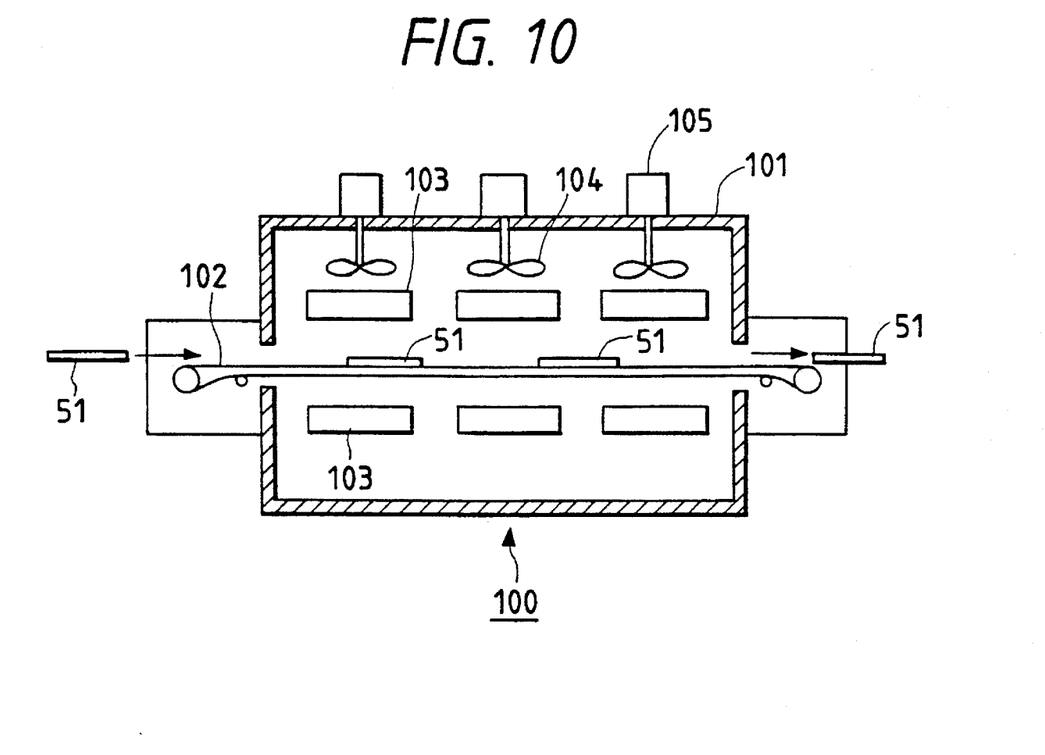
FIG. 10 is a sectional view showing a heating device for heating a substrate attached with solder balls to form bumps on the substrate.
Figure 11:
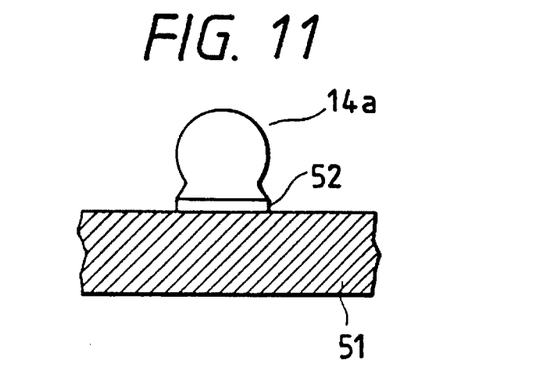
FIG. 11 is a side view of a bump formed on an electrode of the substrate.

On the other hand, the non-defective substrate 51 is transferred to a heating device. FIG. 10 is a sectional view showing this heating device 100. The heating device 100 includes a box-shaped furnace 101, a conveyer 102 for conveying the substrate 51 into the furnace 101 and out from the furnace 101, heaters 103 provided in the furnace 101, fans 104 for circulating the heated air within the furnace 101, and motors 105 for driving the fans 104. The substrate introduced into the furnace 101 is heated by the heaters 103 and the circulated hot air within the furnace to a temperature (about 200° C.–230° C.) higher than a melting point 183° C. of the solder ball 14. Each of the solder balls 14 is melted due to the heat to expand on the corresponding electrode 52. Thereafter, by cooling the substrate 51, a bump 14a is formed on the electrode 52 as shown in FIG. 11.

Now, a second preferred embodiment of the present invention will be described hereinbelow with reference to FIG. 12.

Figure 12:
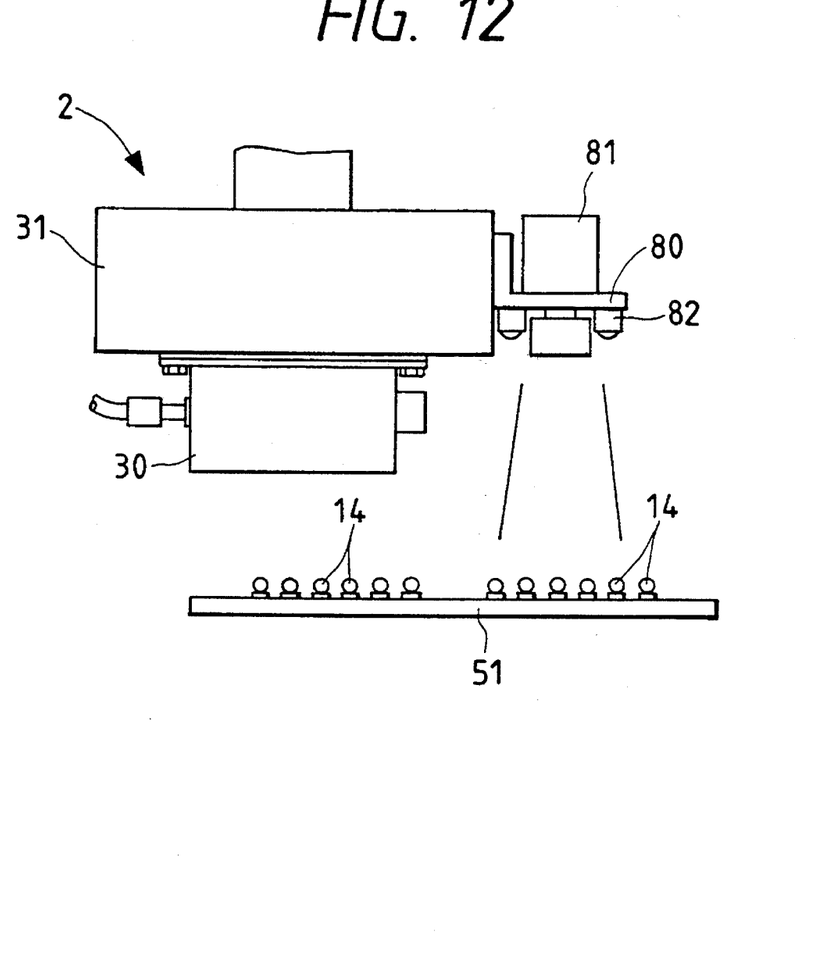
FIG. 12 is a side view of the main portion for explaining a solder ball attaching error detecting procedure of a solder ball attaching apparatus according to a second preferred embodiment of the present invention.

In FIG. 12, a bracket 80 is fixed to a side of the upper case 31 of the pickup head 2. On this bracket 80 are mounted a camera 81 and light sources 82. With this arrangement, after lowering and raising the pickup head 2 to attach the solder balls 14 onto the electrodes of the substrate 51, the camera 81 is moved horizontally in the X and Y directions to observe the surface of the substrate 51 so as to check whether the solder balls 14 are present on all the electrodes 52. In this case, since the upper surfaces of the solder balls 14 provide mirror reflection, presence or absence of the solder balls 14 can be easily determined by irradiating light onto the solder balls 14 from the light sources 82.

In the foregoing first preferred embodiment, the substrate 51 is used as a workpiece to be processed. On the other hand, an electronic element, such as a chip, may also be used as the workpiece.

Now, a third preferred embodiment of the present invention will be described hereinbelow.

Figure 13:
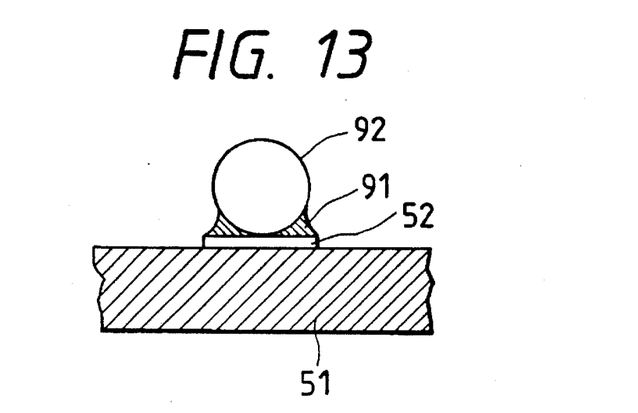
FIG. 13 is a diagram for explaining a third preferred embodiment of the present invention.

FIG. 13 is a diagram for explaining the third preferred embodiment. As a bump, one shown in FIG. 13 is known. Specifically, in FIG. 13, a conductive meal ball 92 other than solder, such as gold or copper, is coupled mechanically and electrically onto the electrode 52 via a bond 91. The bond 91 is conductive, and is hardened by heating. For forming the bump of this kind, the solder ball attaching apparatus of each of the first and second preferred embodiments can be used without modification. Specifically, the bump shown in FIG. 13 can be formed by only changing the solder ball 14 to the conductive metal ball 92 and the flux 42 to the bond 91. After the conductive metal balls 92 are attached onto the electrodes 52 of the substrate 51, the substrate 51 is transferred to the heating device 100 shown in FIG. 10 as in the first preferred embodiment, so as to heat the substrate 51 for hardening the bond 91. By fixing the conductive metal balls 92 onto the electrodes 52 using the bond 91, the bumps are formed as shown in FIG. 13.

As appreciated, in the foregoing preferred embodiments, the bond 91 may be generalized to an adhesive, and the adhesive and the flux 42 may be generalized to a bonding material.

While the present invention has been described in terms of the preferred embodiments, the invention is not to be limited thereto, but can be embodied in various ways without departing from the principle of the invention as defined in the appended claims.

What is claimed is:

1. A conductive metal ball attaching apparatus for attaching a plurality of conductive metal balls onto electrodes of a workpiece, said apparatus comprising:

a pickup head having at its lower side a plurality of absorber holes for vacuum-absorbing the conductive metal balls;

light detecting means for detecting light entering said pickup head through at least one of said absorber holes;

a conductive metal ball feed section for feeding the conductive metal balls to said pickup head;

a bonding material feed section for feeding a bonding material;

a workpiece positioning section for positioning the workpiece;

a discard section for discarding the conductive metal ball absorbed to the absorber hole of said pickup head and applied with the bonding material;

pickup head moving means for moving said pickup head to said conductive metal ball feed section, said bonding material feed section, said workpiece positioning section and said discard section;

first light irradiating means for irradiating light onto the lower side of said pickup head while the pickup head moves from said conductive metal ball feed section to said bonding material feed section;

second light irradiating means for irradiating light onto the lower side of said pickup head while the pickup head moves from said bonding material feed section to said workpiece positioning section; and attaching error detecting means for detecting an attaching error of the conductive metal ball onto said workpiece.

2. The conductive metal ball attaching apparatus according to claim 1, wherein said first light irradiating means is arranged between said conductive metal ball feed section and said bonding material feed section, and said second light irradiating means is arranged between said bonding material feed section and said workpiece positioning section.

3. The conductive metal ball attaching apparatus according to claim 1, wherein each of said first and second light irradiating means includes a light emitting portion in a line shape having a longitudinal axis which crosses a moving direction of said pickup head.

4. The conductive metal ball attaching apparatus according to claim 1, wherein said attaching error detecting means detects the conductive metal ball which fails to be attached onto said workpiece and remains on said pickup head.

5. The conductive metal ball attaching apparatus according to claim 4, wherein said attaching error detecting means includes a light-emitting portion for irradiating light along the lower side of said pickup head, and a light-receiving portion for receiving the light irradiated from said light-emitting portion.

6. The conductive metal ball attaching apparatus according to claim 4, wherein said attaching error detecting means is arranged between said workpiece positioning section and said conductive metal ball feed section.

7. The conductive metal ball attaching apparatus according to claim 1, wherein said attaching error detecting means monitors a state of the conductive metal balls attached to said workpiece.

8. The conductive metal ball attaching apparatus according to claim 7, wherein said attaching error detecting means includes a camera.

9. The conductive metal ball attaching apparatus according to claim 1, wherein said conductive metal ball is a solder ball, and said bonding material is flux.

10. The conductive metal ball attaching apparatus according to claim 1, wherein said bonding material is an adhesive which is hardened by heating.

11. A conductive metal ball attaching method comprising:

a first step of vacuum-absorbing conductive metal balls to respective absorber holes formed at a lower side of a pickup head for picking them up;

a second step of detecting whether the conductive metal balls are vacuum-absorbed to all of said absorber holes;

a third step of applying a bonding material to a lower side of each of the conductive metal balls vacuum-absorbed to said absorber holes;

a fourth step of detecting presence or absence of the conductive metal ball dislodged from said pickup head during said third step;

a fifth step of attaching the conductive metal balls onto electrodes of a workpiece, said conductive metal balls absorbed to the absorber holes of said pickup head and applied with the bonding material; and a sixth step of detecting an attaching error whether all the conductive metal balls absorbed to the absorber holes of said pickup head are attached onto said workpiece.

12. The conductive metal ball attaching method according to claim 11, wherein said first step is repeated when it is detected in said second step that the conductive metal balls are not vacuum-absorbed to all of said absorber holes.

13. The conductive metal ball attaching method according to claim 11, wherein, when the dislodgment of the conductive metal ball is detected in said fourth step, said pickup head is moved to a discard section where the conductive metal balls absorbed to said pickup head are discarded.

14. The conductive metal ball attaching method according to claim 11, wherein, when said attaching error is detected in said sixth step, said pickup head is moved to a discard section where the conductive metal ball which fails to be attached onto said workpiece and remains on said pickup head is discarded.

15. The conductive metal ball attaching method according to claim 11, wherein said conductive metal ball is a solder ball, and said bonding material is flux.

16. The conductive metal ball attaching method according to claim 11, wherein said bonding material is an adhesive which is hardened by heating.

17. A bump forming method for attaching solder balls onto electrodes of a workpiece to form bumps, said method comprising:

a first step of vacuum-absorbing the solder balls to respective absorber holes formed at a lower side of a pickup head for picking them up;

a second step of detecting whether the solder balls are vacuum-absorbed to all of said absorber holes;

a third step of fluxing a lower side of each of the solder balls vacuum-absorbed to said absorber holes:

a fourth step of detecting presence or absence of the solder ball dislodged from said pickup head during said third step;

a fifth step of attaching the solder balls onto the electrodes of the workpiece, said solder balls absorbed to the absorber holes of said pickup head and fluxed:

a sixth step of detecting an attaching error whether all the solder balls absorbed to the absorber holes of said pickup head are attached onto said workpiece: and a seventh step of heating said workpiece to melt the solder balls attached to the electrodes of said workpiece.

18. The bump forming method according to claim 17, wherein said first step is repeated when it is detected in said second step that the solder balls are not vacuum-absorbed to all of said absorber holes.

19. The bump forming method according to claim 17, wherein, when the dislodgment of the solder ball is detected in said fourth step, said pickup head is moved to a discard section where the solder balls absorbed to said pickup head are discarded.

20. The bump forming method according to claim 17, wherein, when said attaching error is detected in said sixth step, said pickup head is moved to a discard section where the solder ball which fails to be attached onto said workpiece and remains on said pickup head is discarded.

21. A bump forming method for attaching conductive metal balls onto electrodes of a workpiece to form bumps, said method comprising:

a first step of vacuum-absorbing the conductive metal balls to respective absorber holes formed at a lower side of a pickup head for picking them up;

a second step of detecting whether the conductive metal balls are vacuum-absorbed to all of said absorber holes;

a third step of applying an adhesive to a lower side of each of the conductive metal balls vacuum-absorbed to said absorber holes;

a fourth step of detecting presence or absence of the conductive metal ball dislodged from said pickup head during said third step;

a fifth step of attaching the conductive metal balls onto the electrodes of the workpiece, said conductive metal balls absorbed to the absorber holes of said pickup head and applied with the bond;

a sixth step of detecting an attaching error whether all the conductive metal balls absorbed to the absorber holes of said pickup head are attached onto said workpiece; and a seventh step of heating said workpiece to harden said adhesive applied to the conductive metal balls.

22. The bump forming method according to claim 21, wherein said first step is repeated when it is detected in said second step that the conductive metal balls are not vacuum-absorbed to all of said absorber holes.

23. The bump forming method according to claim 21, wherein, when the dislodgment of the conductive metal ball is detected in said fourth step, said pickup head is moved to a discard section where the conductive metal balls absorbed to said pickup head are discarded.

24. The bump forming method according to claim 21, wherein, when said attaching error is detected in said sixth step, said pickup head is moved to a discard section where the conductive metal ball which fails to be attached onto said workpiece and remains on said pickup head is discarded.

* * * * *